United States Patent
Sugihara

(10) Patent No.: US 8,629,001 B2
(45) Date of Patent: Jan. 14, 2014

(54) SEMICONDUCTOR DEVICE AND METHOD OF MANUFACTURING SEMICONDUCTOR DEVICE

(75) Inventor: Koichi Sugihara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 250 days.

(21) Appl. No.: 12/815,703

(22) Filed: Jun. 15, 2010

(65) Prior Publication Data

US 2011/0006417 A1    Jan. 13, 2011

(30) Foreign Application Priority Data

Jul. 13, 2009 (JP) ................................. 2009-164841

(51) Int. Cl.
*H01L 21/00* (2006.01)

(52) U.S. Cl.
USPC .......... 438/106; 438/107; 438/125; 438/126; 438/458; 257/686; 257/693; 257/E25.023; 257/E23.085; 257/E21.449; 257/E21.5; 257/E21.506

(58) Field of Classification Search
USPC .................. 257/686, 693, E25.021, E25.023, 257/E23.085, E21.499, E21.5, E21.506; 438/106, 107, 125, 126, 458
See application file for complete search history.

(56) References Cited

U.S. PATENT DOCUMENTS

| | | | |
|---|---|---|---|
| 6,518,655 B2 | 2/2003 | Morinaga et al. | |
| 6,936,525 B2 | 8/2005 | Nishiyama et al. | |
| 7,276,783 B2 | 10/2007 | Goller et al. | |
| 2002/0011655 A1 | 1/2002 | Nishiyama et al. | |
| 2003/0092252 A1* | 5/2003 | Nishiyama et al. | 438/613 |
| 2004/0232543 A1* | 11/2004 | Goller et al. | 257/700 |
| 2007/0037321 A1* | 2/2007 | Higashino et al. | 438/109 |
| 2010/0244208 A1* | 9/2010 | Pagaila et al. | 257/659 |

FOREIGN PATENT DOCUMENTS

| | | |
|---|---|---|
| EP | 1150552 | 10/2001 |
| JP | 2000-294722 | 10/2000 |
| JP | 2001308116 | 11/2001 |
| JP | 2002-124625 | 4/2002 |
| JP | 2002-151643 | 5/2002 |
| JP | 2010-073893 | 4/2010 |

OTHER PUBLICATIONS

Japanese Office Action for Japanese Application No. 2009-164841 mailed on May 22, 2012.

* cited by examiner

*Primary Examiner* — Julio J Maldonado
*Assistant Examiner* — Hajar Kolahdouzan
(74) *Attorney, Agent, or Firm* — White & Case LLP

(57) ABSTRACT

A semiconductor device includes: a first semiconductor element having a first terminal surface on which a first terminal is disposed and a first rear surface on which no terminal is disposed; a second semiconductor element having a second terminal surface on which a second terminal is disposed and a second rear surface on which no terminal is disposed, the second rear surface being bonded to the first rear surface; a terminal member having a surface set substantially flush with the second terminal surface; and a conductive wire connecting the terminal member and the first terminal.

7 Claims, 9 Drawing Sheets

ULTRAVIOLET

SEMICONDUCTOR DEVICE AND METHOD OF MANUFACTURING SEMICONDUCTOR DEVICE

CROSS-REFERENCE TO RELATED APPLICATIONS

This application is based upon and claims the benefit of priority from Japanese Patent Application No. 2009-164841, filed on Jul. 13, 2009; the entire contents of which are incorporated herein by reference.

FIELD

Embodiments described herein relate generally to a semiconductor device and a method of manufacturing a semiconductor device.

BACKGROUND

There has been known an art of manufacturing a semiconductor component by two-dimensionally arranging a plurality of semiconductor chips on a tacky sheet, coating the entire surface with resin, and forming electrodes collectively on the plural semiconductor chips. The collective formation of the electrodes on the plural semiconductor chips enables the low-cost manufacture of the semiconductor component.

In recent years, a high-functional and compact semiconductor device called SiP (System in Package) has been in wider use in portable terminals and digital home electric appliances. In manufacturing the SiP semiconductor device by using the above-described conventional art, the two-dimensional arrangement of the semiconductor elements makes it difficult to miniaturize the semiconductor device.

DETAILED DESCRIPTION

A semiconductor device according to an embodiment of the present invention includes: a first semiconductor element having a first terminal surface on which a first terminal is disposed and a first rear surface on which no terminal is disposed; a second semiconductor element having a second terminal surface on which a second terminal is disposed and a second rear surface on which no terminal is disposed, the second rear surface being bonded to the first rear surface; a terminal member having a surface set substantially flush with the second terminal surface; and a conductive wire connecting the terminal member and the first terminal.

First Embodiment

Figure 1:
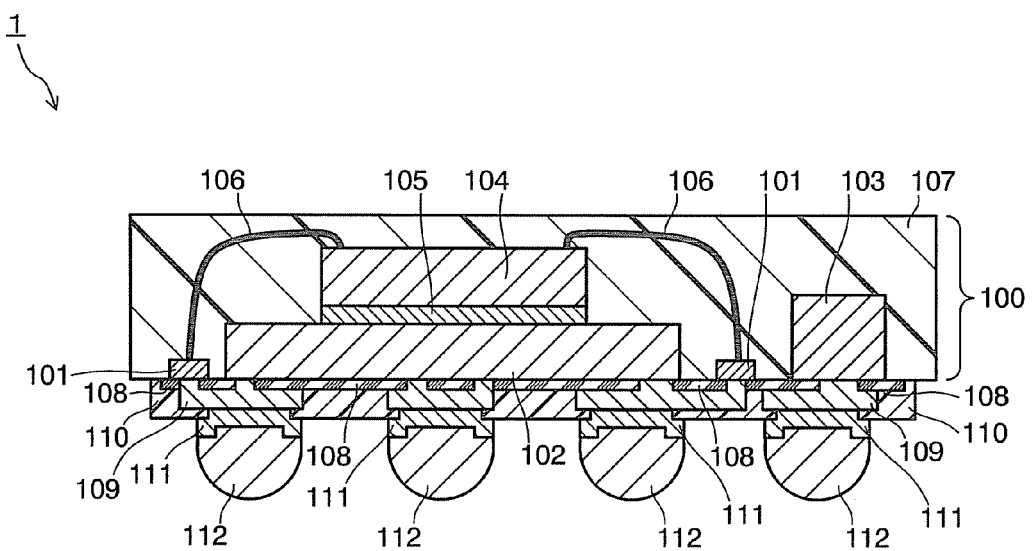
FIG. 1 is a cross-sectional view showing a semiconductor device 1 of an embodiment of the present invention.

Hereinafter, a mode for carrying out the present invention will be described based on the drawings. FIG. 1 is a cross-sectional view showing a semiconductor device 1 according to a first embodiment of the present invention.

As shown in FIG. 1, the semiconductor device 1 includes rewiring terminals 101, a semiconductor chip 102, a chip component 103, a semiconductor chip 104, an element adhesive layer 105, wires 106, a sealing resin 107, insulating films 108, wirings 109, protective films 110, UBM (Under Bump Metal) films 111, and solder bumps 112.

The rewiring terminals 101 are terminal members connected to the semiconductor chip 104 via the wires 106. The rewiring terminals 101 each are made of a conductor such as, for example, copper, silver, gold, or aluminum. In case that wire bonding to the conductor material itself is difficult, such as copper, the surface of the conductor is plated with at least one of silver, a multi layer of nickel and gold, and a multilayer of nickel, palladium, and gold. As a result, the bonding of the rewiring terminals 101 and the wires 106 is possible.

The semiconductor chip 102 is a second semiconductor element and has a function as a computation processing part, for instance. The semiconductor chip 102 is an electronic element which includes a terminal surface and a rear surface connected to the terminal surface via side surfaces and which is formed in a substantially rectangular parallelepiped shape. The "terminal surface" refers to a surface to/from which an electric signal is input/output and electrodes and so on, not shown, are disposed thereon. The semiconductor chip 102 is disposed with the terminal surface set on a lower side in FIG. 1.

The chip component 103 is an electronic element including electrodes and is, for example, a capacitor or a resistor.

The semiconductor chip 104 is a first semiconductor element and has a function as a memory, for instance. The semiconductor chip 104, similarly to the semiconductor chip 102, includes a terminal surface (upper surface) and a rear surface. The terminal surface (upper surface) of the semiconductor chip 104 is set on an upper side in FIG. 1. The rear surface of the semiconductor chip 104 faces the rear surface of the semiconductor chip 102. The terminal surface of the semiconductor chip 104 is connected to the rewiring terminals 101 by the wires 106.

The element adhesive layer 105 is made of an adhesive, for example, silver paste, for bonding the semiconductor chip 102 and the semiconductor chip 104 with each other.

The sealing resin 107 seals the rewiring terminals 101, the semiconductor chip 102, the chip component 103, the semiconductor chip 104, the element adhesive layer 105, and the wires 106. The sealing resin 107 is made of, for example, thermosetting resin that contains fine quartz powder or the like as a filler.

When the sealing resin 107 is thermally set, the rewiring terminals 101, the semiconductor chip 102, the chip component 103, the semiconductor chip 104, the element adhesive layer 105, and the wires 106 (hereinafter, referred to as the rewiring terminals 101 etc.) are integrated. As a result, the rewiring terminals 101 etc. can be handled as a single member. A structure including the rewiring terminals 101 etc. sealed by the sealing resin 107 is called a pseudo wafer 100.

Both ends of the pseudo wafer 100 are cut off so that the pseudo wafer 100 can be processed by an existing wafer process of a semiconductor manufacturing device. That is, the pseudo wafer 100 has a size corresponding to the size of an existing semiconductor wafer so as to be processable by the existing wafer process.

A height-direction thickness of the pseudo wafer 100 is preferably set so that the wires 106 are not exposed to the outside. However, the thickness of the pseudo wafer 100 is appropriately changeable in consideration of warp and strength after the sealing resin 107 cures and thickness processable by the wafer process.

In the pseudo wafer 100, the terminal surface of the semiconductor chip 102, a terminal surface of the chip component 103, and one surface of each of the rewiring terminals 101 (hereinafter the terminal surface of the semiconductor chip 102 etc.) are exposed from the sealing resin 107 and are set substantially flush with one another. On a surface of the pseudo wafer 100 from which the terminal surface of the semiconductor chip 102 etc. are exposed, the insulating films 108, the wirings 109, the protective films 110, the UBM films 111, and the solder bumps 112 are formed in sequence in the course of the wafer process.

The insulating films 108 prevent a short circuit between, for example, the semiconductor chip 104 and the chip component 103. The wirings 109 electrically connect, for example, the semiconductor chip 102 and the chip component 103. The protective films 110 prevent a short circuit and the like of the wirings 109. The UBM films 111 function as bases to form the solder bumps 112 on.

The solder bumps 112 are portions joined to a printed circuit board, not shown, on which the semiconductor device 1 is mounted. Electric signals are transmitted to/from the semiconductor chips 102, 104, and the chip component 103 from/to the printed circuit board via the solder bumps 112.

The solder bumps 112 are formed in such a manner that after the UBM films 111 are plated, solder is supplied onto the UBM films 111, and the solder is melted by heating. It is also possible to form the solder bumps 112 by printing solder paste onto the UBM films 111. That is, the printed solder paste is a source of the solder bumps 112.

Further, when a pitch between the UBM films 111 is 0.3 mm or more, solder balls (not shown) instead of the solder bumps 112 can be attached on the UBM films 111.

To attach the solder balls on the UBM films 111, the solder balls are put on the UBM films 111 after flux for melting an oxide is applied on the UBM films 111. Then, the solder balls melt by reflowing, so that the solder balls and the UBM films 111 are joined with each other.

Next, manufacturing processes of the above-described semiconductor device 1 will be described in sequence with reference to FIG. 2 to FIG. 17. FIG. 2 to FIG. 17 are cross-sectional views showing the manufacture of the semiconductor device 1 in order of processes.

Figure 2:
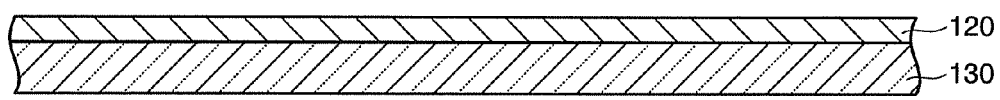
FIG. 2 is a cross-sectional view showing the manufacture of the semiconductor device 1 in order of processes.

As shown in FIG. 2, a support substrate 130 on which a tacky sheet 120 is stuck is used for the manufacture of the semiconductor device 1.

The support substrate 130 is a base to form the pseudo wafer 100 on. Preferably, the support substrate 130 is made of a material having high flatness, strength, dimension stability, for example, is made of a glass plate or a quartz plate. Further, the support substrate 130 is preferably in a circular shape so that the pseudo wafer 100 can be processed by an existing wafer process. If the existing wafer process is capable of processing a rectangular wafer, the support substrate 130 may be in a rectangular shape. That is, the shape of the support substrate 130 can be variously changed according to the existing wafer process.

An outside dimension of the support substrate 130 is desirably larger than the size of a regular wafer processed by the wafer process by about several mm. This is because the cutting of the pseudo wafer 100 to the size of the existing wafer is taken into consideration.

As the tacky sheet 120, a material whose tacky strength is decreased by the irradiation of UV (Ultraviolet) (for example, acrylic material) is used. Incidentally, as the tacky sheet 120, a material whose tacky strength is decreased by heat or light irradiation may be used.

The tacky sheet 120 desirably has a modulus of elasticity or thickness so that the bonding of the wires 106 is possible. The tacky sheet 120 is attached to a roller device (not shown) via a release film (not shown). Thereafter, the tacky sheet 120 is attached to the support substrate 130 by the roller device.

Figure 3:
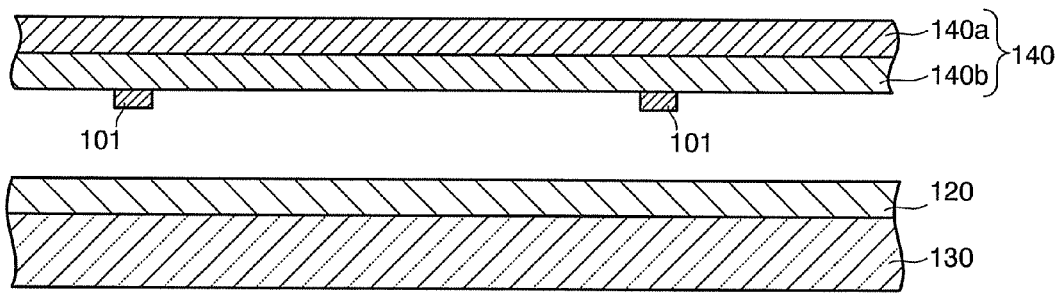
FIG. 3 is a cross-sectional view showing the manufacture of the semiconductor device 1 in order of processes.

Next, as shown in FIG. 3, a transfer sheet 140 is disposed so as to face the tacky sheet 120. The transfer sheet 140 includes a base film 140a and a tackiness agent film 140b pasted on the base film 140a.

The tackiness agent film 140b is lower in tackiness than the tacky sheet 120. A constituent material of the tackiness agent film 140b is desirably a material that can be peeled off cleanly without any paste left. Desirably, the rewiring terminals 101 are formed on the tackiness agent film 140b in advance. For forming the rewiring terminals 101, for example, a copper foil is clad on the tackiness agent film 140b and the selective etching using a mask is performed on the copper foil.

The rewiring terminals 101 are held by the tacky strength of the tackiness agent film 140b. On a surface of the tackiness agent film 140b, only areas where the rewiring terminals 101 are formed need to have the tacky strength. It doesn't matter if the tackiness in an area other than the areas where the rewiring terminals 101 are formed is lost during a process of forming the rewiring terminals 101.

Figure 4:
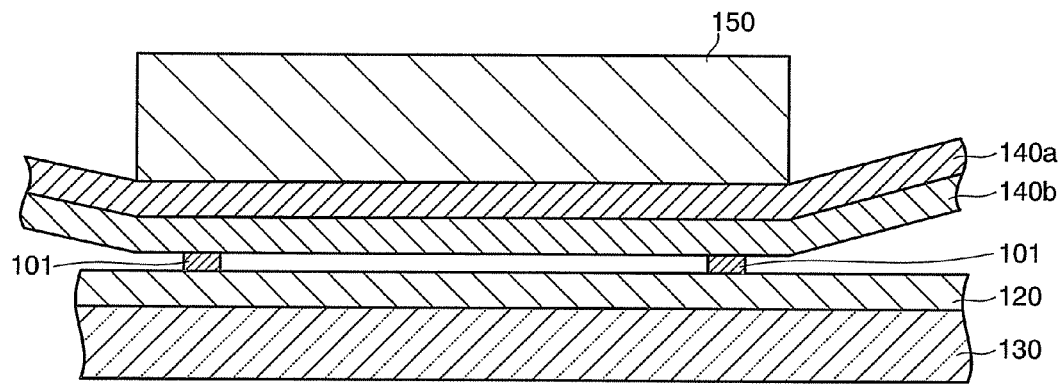
FIG. 4 is a cross-sectional view showing the manufacture of the semiconductor device 1 in order of processes.
Figure 5:
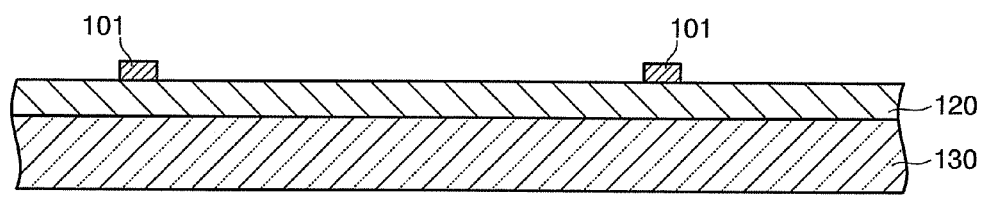
FIG. 5 is a cross-sectional view showing the manufacture of the semiconductor device 1 in order of processes.

Next, as shown in FIG. 4 and FIG. 5, the transfer sheet 140 is pressed against the tacky sheet 120 by a pressure-bonding head 150. After the transfer sheet 140 is pressed against the tacky sheet 120, the pressure-bonding head 150 and the transfer sheet 140 are separated from the tacky sheet 120. As a result, the rewiring terminals 101 are peeled off from the tackiness agent film 140b having a weaker tacky strength than that of the tacky sheet 120 and the rewiring terminals 101 are transferred onto the tacky sheet 120.

In a later-described process, the semiconductor chip 102 and the chip component 103 are placed on the tacky sheet 120. Here, for enhanced position accuracy to the rewiring terminals 101, terminals serving as alignment marks are preferably transferred onto the tacky sheet 120 together with the rewiring terminals 101 in the transfer process previously described. Placing the semiconductor chip 102 and the chip component 103 with the transferred alignment marks serving as guides makes it possible to obtain good relative position accuracy.

Figure 6:
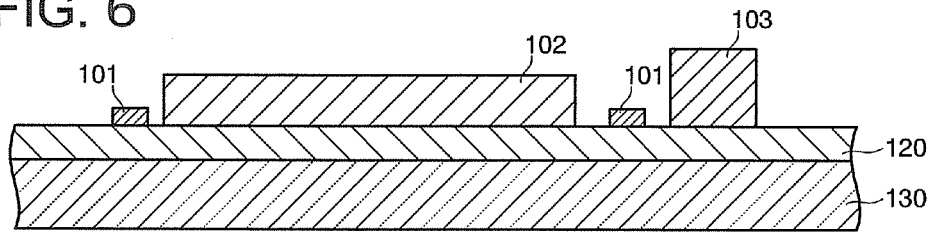
FIG. 6 is a cross-sectional view showing the manufacture of the semiconductor device 1 in order of processes.

Next, as shown in FIG. 6, the semiconductor chip 102 and the chip component 103 are placed on the tacky sheet 120 having the transferred rewiring terminals 101. The semiconductor chip 102 and the chip component 103 are fixed by the tacky strength of the tacky sheet 120. The semiconductor chip 102 and the chip component 103 are disposed so that the terminal surfaces thereof face (are in contact with) the tacky sheet 120.

Figure 7:
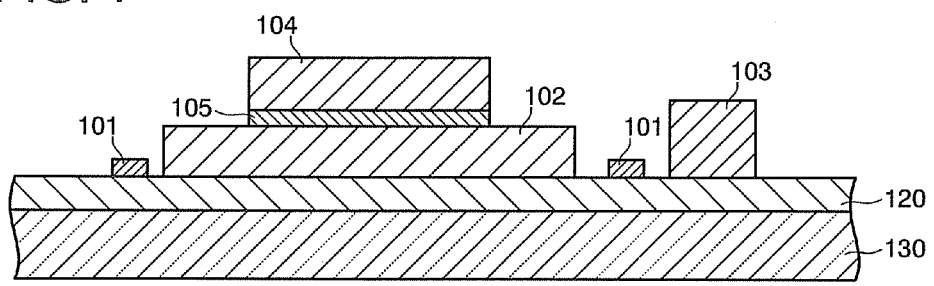
FIG. 7 is a cross-sectional view showing the manufacture of the semiconductor device 1 in order of processes.

Further, as shown in FIG. 7, the semiconductor chip 104 is placed via the element adhesive layer 105 on the semiconductor chip 102 placed on the tacky sheet 120.

Incidentally, a plurality of the semiconductor chips 102 and the chip components 103 can be disposed on the tacky sheet 120. Further, the chip component 103 is not sometimes disposed on the tacky sheet 120.

Further, an arrangement relation between the semiconductor chip 104 and the semiconductor chip 102 can be reversed. That is, the semiconductor chip 102 may be placed on an upper side of the semiconductor chip 104, with the semiconductor chip 104 being disposed on the tacky sheet 120. In this case, the terminal surface of the semiconductor chip 104 is set downward and the terminal surface of the semiconductor chip 102 is set upward, and the rear surfaces of these chips face each other.

Figure 8:
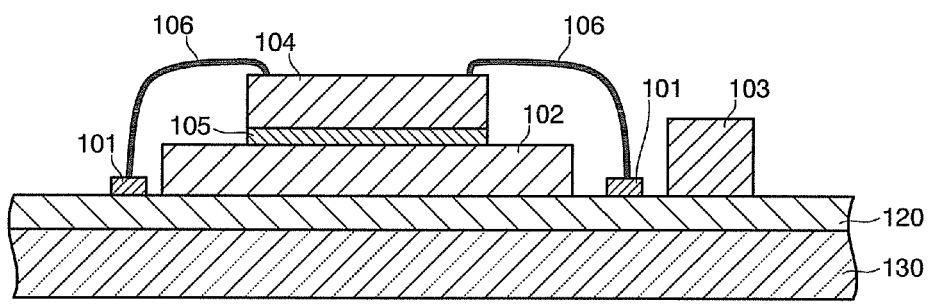
FIG. 8 is a cross-sectional view showing the manufacture of the semiconductor device 1 in order of processes.
Figure 9:
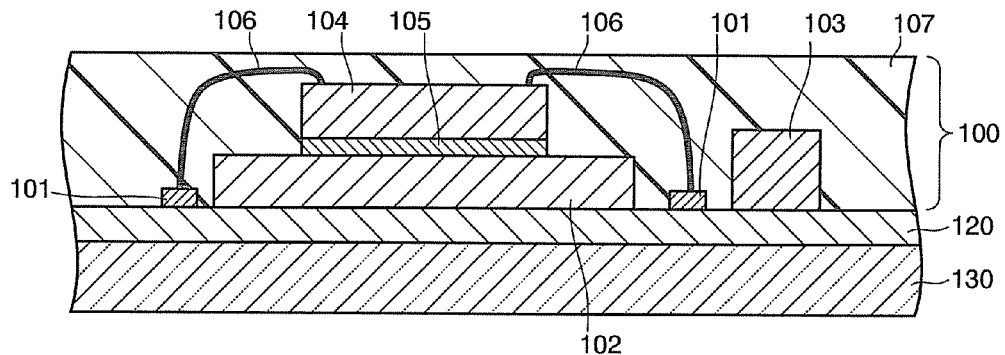
FIG. 9 is a cross-sectional view showing the manufacture of the semiconductor device 1 in order of processes.

Next, as shown in FIG. 8, the semiconductor chip 104 and the rewiring terminals 101 are connected by the wires 106. Next, as shown in FIG. 9, the rewiring terminals 101 etc. are sealed by the sealing resin 107. Concretely, a mold and a press, which are not shown, are used. First, the support substrate 130 is set in the heated mold and next the sealing resin 107 is supplied. Then, the mold is closed by the press for the molding. At this time, the sealing resin 107 melts in the mold by receiving heat to have flowability and is filled onto the support substrate 130, and thereafter is cured. Here, the sealing resin 107 is sometimes cured insufficiently. In this case, the sealing resin 107 in an insufficiently cured state is taken out from the mold and is further heated (post-cure), whereby the sealing resin 107 can be sufficiently cured.

Incidentally, it is also possible to seal the rewiring terminals 101 etc. by printing the sealing resin 107 onto the support substrate 130. In this case, a mask is put on the support substrate 130 and the sealing resin 107 in liquid form is dropped from above the mask. Next, an upper surface of the mask is squeegeed to a predetermined thickness. After the completion of the squeegeeing, the mask is removed and the whole structure including the support substrate 130 is put into an oven to be heated, whereby the sealing resin 107 is cured.

Figure 10:
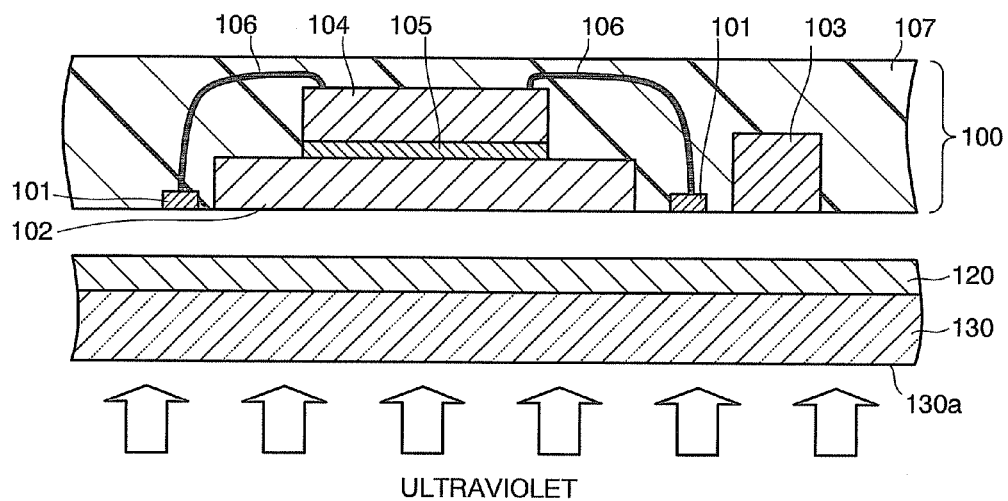
FIG. 10 is a cross-sectional view showing the manufacture of the semiconductor device 1 in order of processes.
Figure 11:
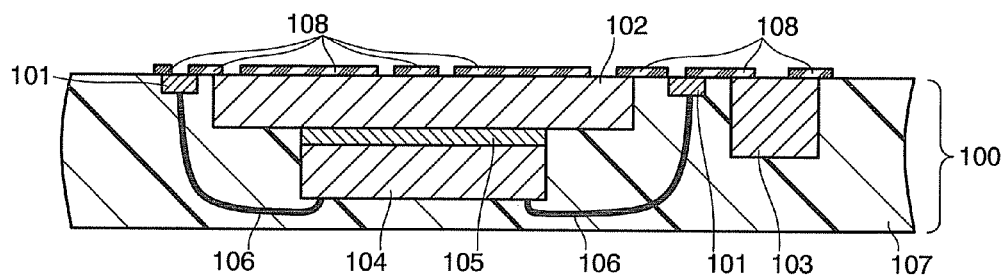
FIG. 11 is a cross-sectional view showing the manufacture of the semiconductor device 1 in order of processes.
Figure 12:
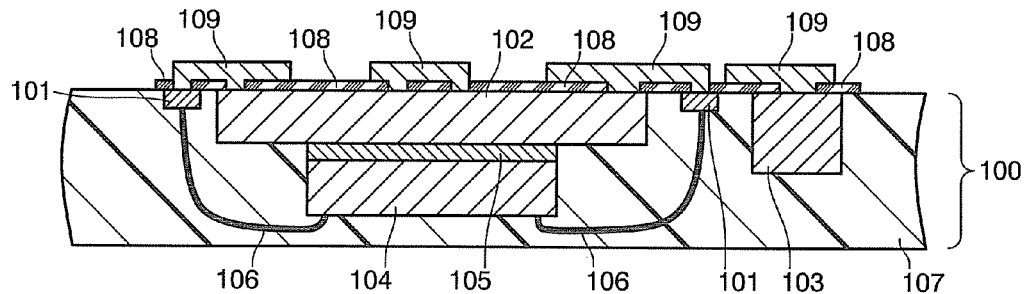
FIG. 12 is a cross-sectional view showing the manufacture of the semiconductor device 1 in order of processes.
Figure 13:
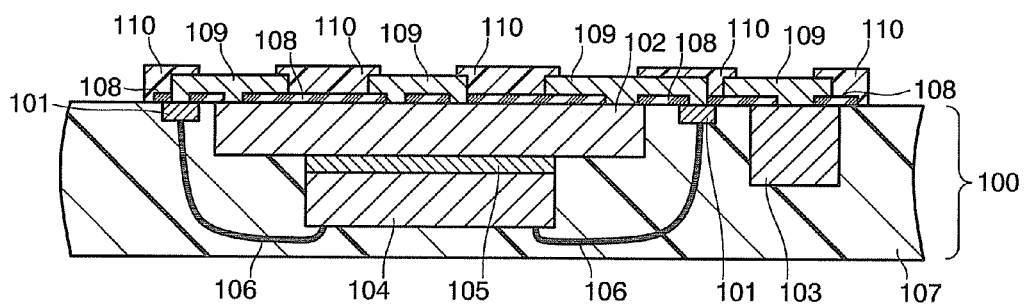
FIG. 13 is a cross-sectional view showing the manufacture of the semiconductor device 1 in order of processes.
Figure 14:
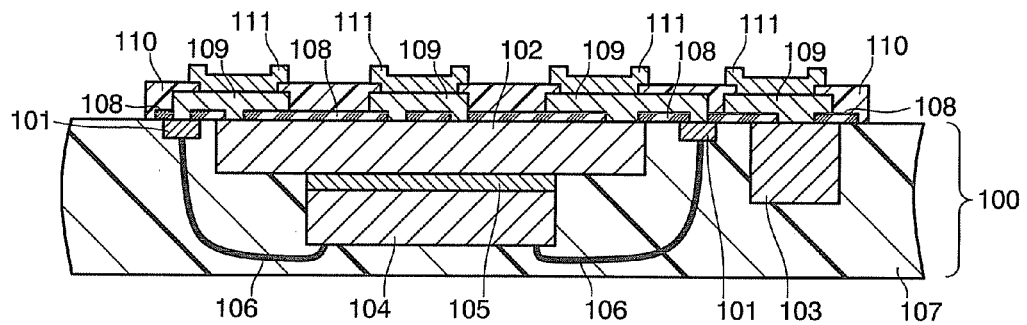
FIG. 14 is a cross-sectional view showing the manufacture of the semiconductor device 1 in order of processes.
Figure 15:
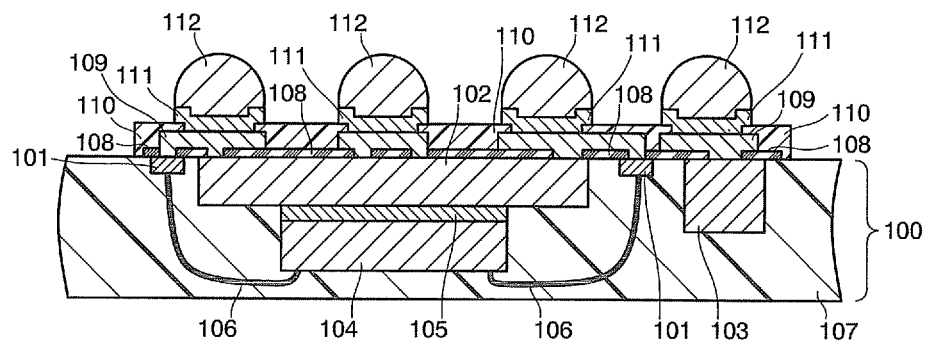
FIG. 15 is a cross-sectional view showing the manufacture of the semiconductor device 1 in order of processes.

Next, as shown in FIG. 10, by ultraviolet irradiation from a direction of a rear surface 130a of the support substrate 130, the tacky strength of the tacky sheet 120 is weakened, and the pseudo wafer 100 is peeled off from the tacky sheet 120.

Next, as shown in FIG. 11 to FIG. 15, on the pseudo wafer 100 peeled off from the tacky sheet 120, the insulating films 108, the wirings 109, the protective films 110, the UBM films 111, and the solder bumps 112 are formed in sequence.

Figure 16:
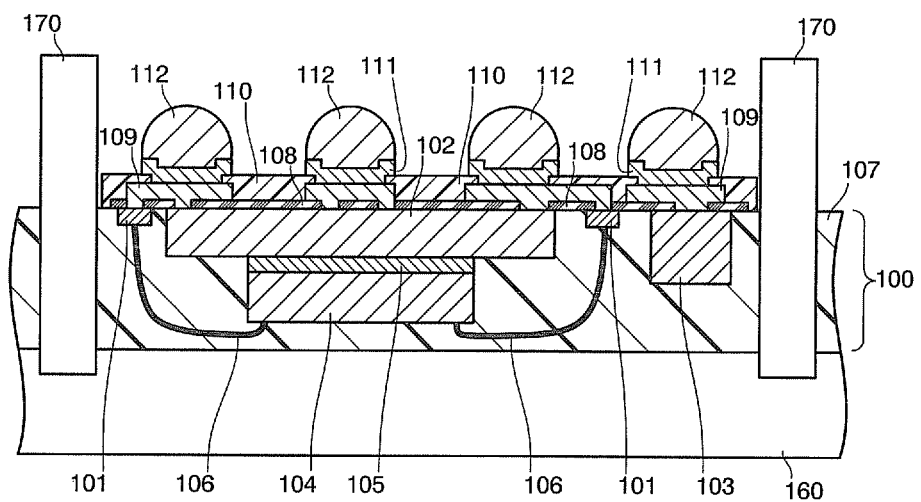
FIG. 16 is a cross-sectional view showing the manufacture of the semiconductor device 1 in order of processes.

Next, as shown in FIG. 16, on a lower surface of the pseudo wafer 100 on which the solder bumps 112 are formed (on a surface opposite the surface where the solder bumps 112 are formed), a dicing tape 160 is pasted (here, in FIG. 16, the dicing tape 160 is not hatched for easier view of the pseudo wafer 100). The dicing tape 160 serves to fix the pseudo wafer 100 on a chuck table (not shown).

The chuck table is a table on which the pseudo wafer 100 is cut at predetermined positions (for example, portions, of the sealing resin 107, where the protective films 110 and so on are not formed in FIG. 16) to the same size as the existing semiconductor wafer. The pseudo wafer 100 fixed on the chuck table is cut by using dicing blades 170 (in FIG. 16, the dicing blades 170 are not hatched similarly to the dicing tape 160).

Figure 17:
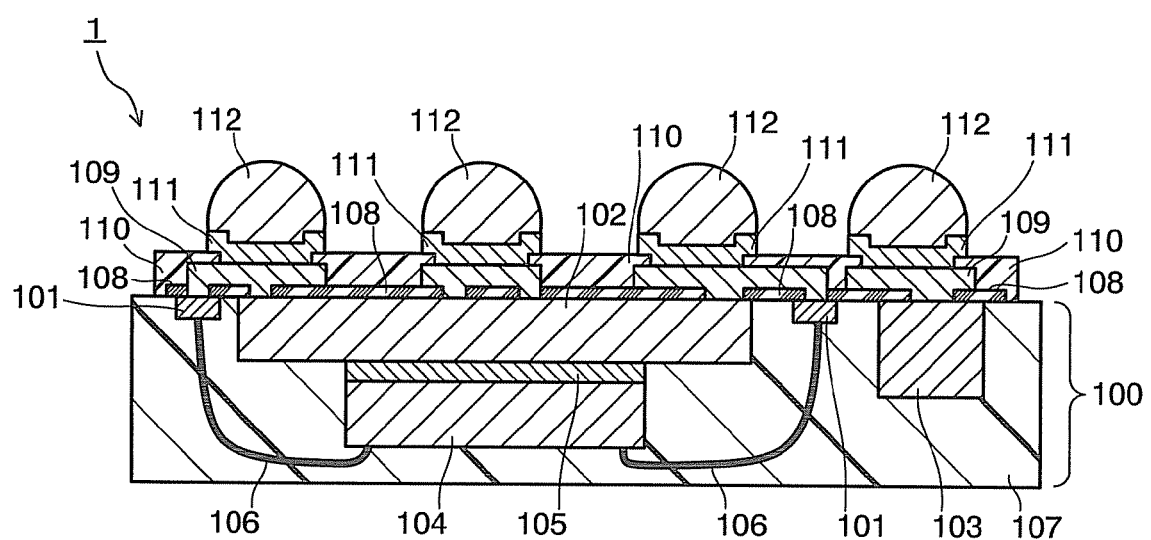
FIG. 17 is a cross-sectional view showing the manufacture of the semiconductor device 1 in order of processes.
Figure 18:
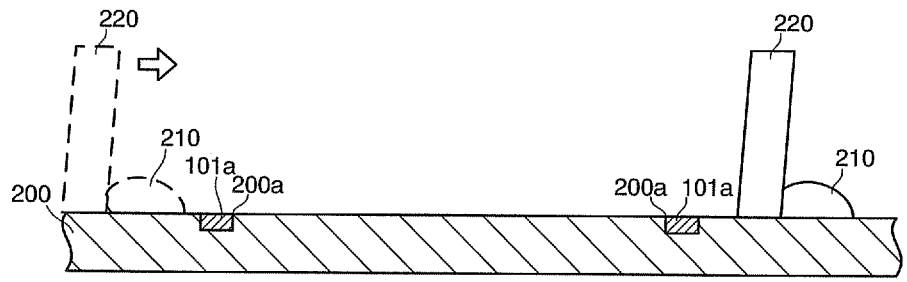
FIG. 18 is a cross sectional view showing the formation of rewiring terminals 101 according to a modification example 1 in order of processes.

Through the above-described processes, the discrete semiconductor device 1 is obtained as shown in FIG. 17. Since the semiconductor device 1 of this embodiment includes the rewiring terminals 101, stable connection of the wires 106 is possible. As a result, the semiconductor chip 102 and the semiconductor chip 104 can be stacked in the semiconductor device 1.

In recent years, as a semiconductor device comes to have higher performance, the chip size of a memory element used in the semiconductor device tends to be larger. When the memory element and a computing element connected to the memory element are arranged alongside each other on a two-dimensional surface, an outside dimension of the semiconductor device increases according to the chip size of the memory element.

In the semiconductor device 1 of this embodiment, the semiconductor chip 102 and the semiconductor chip 104 are stacked. As a result, it is possible to reduce an area of the semiconductor device 1 on the tacky sheet 120 and prevent an increase in the outside dimension of the semiconductor device 1.

Further, the collective wiring process and bump process on the pseudo wafer 100 is possible, enabling the low-cost manufacture of the semiconductor device 1.

In the manufacturing processes of the semiconductor device 1, when the semiconductor device 1 is cut out from the pseudo wafer 100 by the dicing blades 170, the sealing resin 107 is cut. Therefore, it is possible to prevent an adverse effect (occurrence of distortion crack, and so on) that an internal stress of the sealing resin 107 gives to the semiconductor chip 102 and the semiconductor chip 104.

In short, according to the manufacturing method of this embodiment, in the application of portable terminals where the demand for downsizing is strong, it is possible to downsize SiP of a memory-mounted type while making the most of the merits of the manufacturing method of performing the collective processes of a semiconductor wafer using the pseudo wafer 100 (high density, high reliability, low cost).

Further, as described above, in the semiconductor device 1, the semiconductor chip 102 and the semiconductor chip 104 are joined back to back via the element adhesive layer 105. As a result, the semiconductor device 1 can produce various good effects compared with a semiconductor device where the semiconductor chip 102 and the semiconductor chip 104 are not joined back to back.

(Effect 1)

In some case, for example, the semiconductor chip 102 and the semiconductor chip 104 are joined, with the terminal surface of the semiconductor chip 102 and the rear surface of the semiconductor chip 104 facing each other (that is, with the terminal surface of the semiconductor chip 102 set on a lower side in FIG. 17). In this case, in a predetermined area of the terminal surface of the semiconductor chip 102, a joint surface with the rear surface of the semiconductor chip 104 is provided, and the element adhesive layer 105 is formed on this area. At this time, as the element adhesive layer 105, it is necessary to use an adhesive material having an insulating property in order to prevent a short circuit of connection terminals formed on the semiconductor chip 102 with the semiconductor chip 104.

On the other hand, when the semiconductor chip 102 and the semiconductor chip 104 are joined back to back as in the semiconductor device 1, an adhesive having conductivity such as silver paste is usable as the element adhesive layer 105. By the silver paste absorbing an electromagnetic wave (noise) generated from the semiconductor chip 102, it is possible to prevent the semiconductor chip 104 from malfunctioning due to the electromagnetic wave.

(Effect 2)

Similarly, when the semiconductor chip 102 and the semiconductor chip 104 are joined, with the terminal surface of the former facing the rear surface of the latter, the terminal surface of the semiconductor chip 102 may possibly be contaminated by bleed. This contamination will be a cause of the deterioration and conduction failure of connection terminals formed on the semiconductor chip 102. The bleed is a phenomenon that a solvent contained in the element adhesive layer 105 seeps out while spreading on the terminal surface and so on.

Joining the semiconductor chip 102 and the semiconductor chip 104 back to back prevents the deterioration and conduction failure of the connection terminals even if the bleed occurs.

(Effect 3)

Further, the semiconductor chip 104 and the semiconductor chip 102 are sometimes joined, with the terminal surface of the former and the rear surface of the latter facing each other. In this case, if the semiconductor chip 104 is smaller than the semiconductor chip 102, it is necessary to insert a spacer between the semiconductor chip 104 and the semiconductor chip 102 in order to enable the connection between the connection terminals of the semiconductor chip 104 and the rewiring terminals 101 by the wires 106. Joining the semiconductor chip 102 and the semiconductor chip 104 back to back eliminates the need for the insertion of the spacer and accordingly can reduce the manufacturing cost of the semiconductor device 1.

In the foregoing, the semiconductor device 1 and the manufacturing method of the semiconductor device 1 according to one embodiment of the present invention are described, but the present invention is not limited to the above-described embodiment, and various modifications can be made without departing from the spirit of the invention. For example, the method of forming the rewiring terminals 101 on the tacky sheet 120 can be appropriately changed.

MODIFICATION EXAMPLE 1

Next, a modification example 1 of the method of forming the rewiring terminals 101 will be described by using FIG. 18 to FIG. 21. FIG. 18 to FIG. 21 are cross-sectional views showing the formation of the rewiring terminals 101 according to the modification example 1 in order of processes.

The above-described first embodiment employs the transfer for the formation of the rewiring terminals 101 on the support substrate 130. On the other hand, this modification example 1 employs printing using an intaglio plate 200 for the formation of the rewiring terminals 101.

Concretely, metal paste 210 is first dropped to predetermined positions of the intaglio plate 200. For example, the metal paste 210 is dropped to the position of the broken line in FIG. 18. A main material of the metal paste 210 is metal powder of at least one of silver, copper, gold, and aluminum.

Thereafter, the dropped metal paste 210 is flattened by a squeegee 220 (planarization). As a result, part of the metal paste 210 flows into depressions 200a formed in the intaglio plate 200, so that rewiring terminal members 101a are formed. At this time, a depth of the depressions 200a is desirably set so that a thickness of the rewiring terminal members 101a becomes about 10 μm to about 100 μm.

Figure 19:
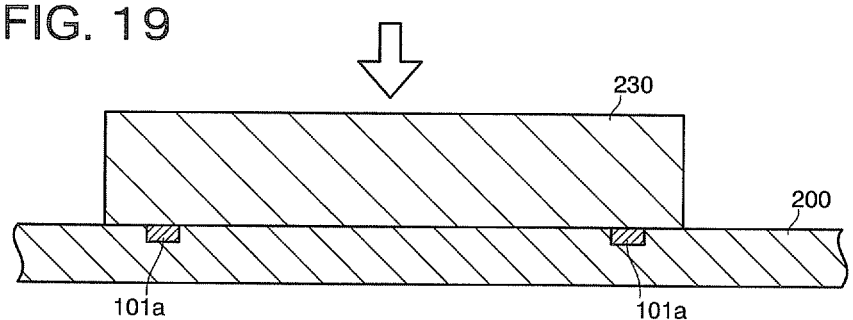
FIG. 19 is a cross sectional view showing the formation of the rewiring terminals 101 according to the modification example 1 in order of processes.

Next, as shown in FIG. 19, a lower surface of a transfer pad 230 is brought into contact with a surface, of the intaglio plate 200, where the depressions 200a are formed. As a result, the rewiring terminal members 101a formed by the metal paste 210 flowing into the depressions 200a come into contact with the transfer pad 230.

Next, the transfer pad 230 is moved to the support substrate 130. At this time, the rewiring terminal members 101a are stuck on the transfer pad 230.

Figure 20:
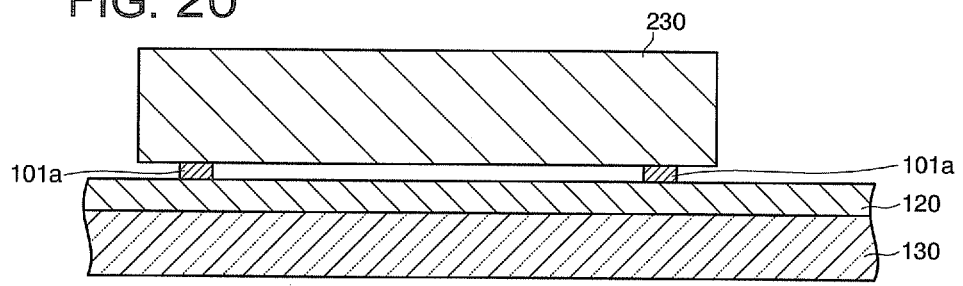
FIG. 20 is a cross sectional view showing the formation of the rewiring terminals 101 according to the modification example 1 in order of processes.

As shown in FIG. 20, the transfer pad 230 is moved close to the support substrate 130 so that the rewiring terminal members 101a are brought into contact with the tacky sheet 120. As a result, the rewiring terminal members 101a are printed onto the support substrate 130 (onto the tacky sheet 120). This printing method is called pad printing.

Incidentally, the rewiring terminal members 101a may be printed onto the support substrate 130 in one process. Alternatively, the rewiring terminal members 101a may be repeatedly printed until the thickness of the rewiring terminal members 101a on the support substrate 130 reaches a predetermined thickness.

In some case, a plurality of the semiconductor devices 1 are manufactured. In this case, the rewiring terminal members 101a may be printed collectively to a plurality of the support substrates 130 corresponding to the plural semiconductor devices 1 which are to be manufactured. The rewiring terminal members 101a may be printed in sequence onto the plural support substrates 130. Further, a predetermined number of the support substrates 130 may be defined as a group and the rewiring terminal members 101a may be printed on per group basis.

Figure 21:
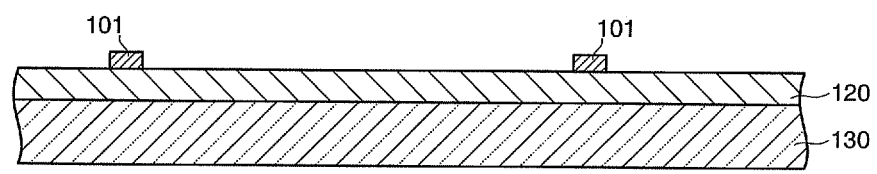
FIG. 21 is a cross sectional view showing the formation of the rewiring terminals 101 according to the modification example 1 in order of processes.

Next, the support substrate 130 on which the rewiring terminal members 101a are printed are dried or burnt, whereby the rewiring terminals 101 shown in FIG. 21 are formed. Incidentally, the support substrate 130 is burnt at a temperature not exceeding a heat resistance temperature of the tacky sheet 120.

As described above, in the modification example 1, it is possible to form the rewiring terminals 101 by printing the rewiring terminal members 101a. Incidentally, instead of the above-described padprinting, screenprinting using a mask may be used for the formation of the rewiring terminals 101. Further, the rewiring terminals 101 may be formed by using a nozzle jetting the metal paste 210 or ink-jetting.

MODIFICATION EXAMPLE 2

In the first embodiment or the modification example 1 described above, the rewiring terminals 101 are transferred onto the tacky sheet 120 by using the transfer sheet 140, or the rewiring terminal members 101a are printed by using the transfer pad 230. Alternatively, the support substrate 130 itself may be used in place of the transfer sheet 140 or the transfer pad 230.

Specifically, the rewiring terminals 101 may be formed directly on the tacky sheet 120 of the support substrate 130 instead of the transfer sheet 140 described in the first embodiment. Further, the tacky sheet 120 on the support substrate 130, instead of the transfer pad 230, may be brought into contact with the intaglio plate 200 described in the modification example 1.

In the above cases, there is no need to use the transfer sheet 140 or the transfer pad 230, which can reduce the manufacturing cost of the semiconductor device 1. Further, using the support substrate 130 itself in place of the transfer sheet 140 or the transfer pad 230 reduces the lead time for forming the rewiring terminals 101, which enables the efficient manufacture of the semiconductor device 1.

MODIFICATION EXAMPLE 3

Figure 22:
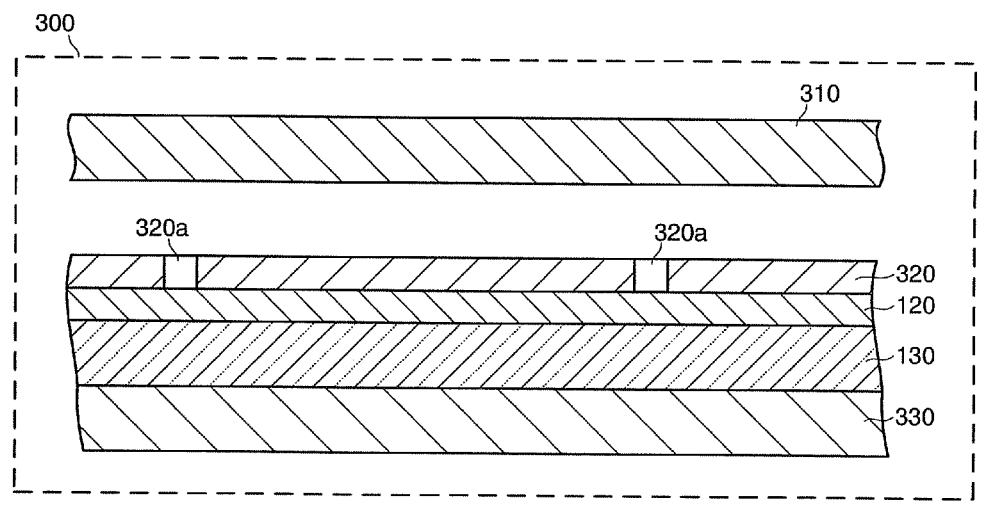
FIG. 22 is a cross sectional view showing the formation of the rewiring terminals 101 according to a modification example 3 in order of processes.
Figure 23:
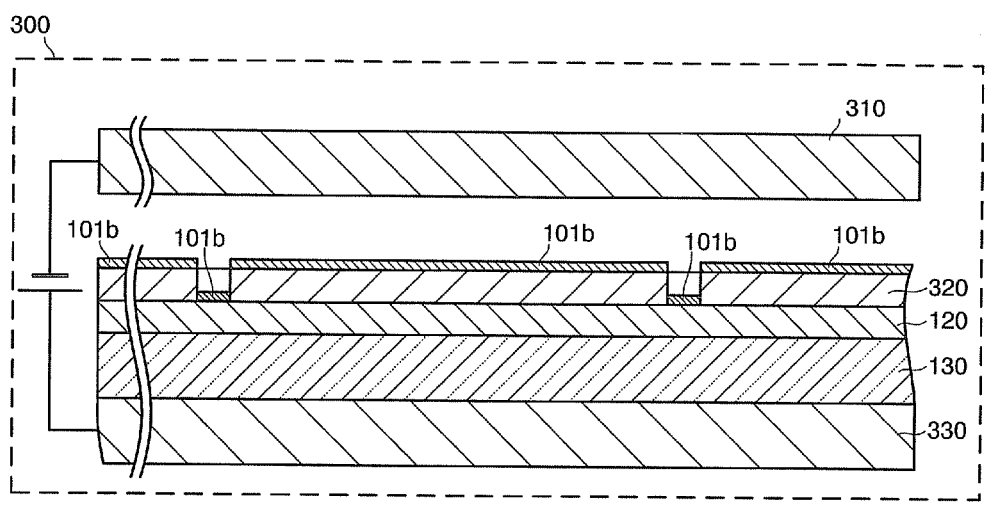
FIG. 23 is a cross sectional view showing the formation of the rewiring terminals 101 according to the modification example 3 in order of processes.
Figure 24:
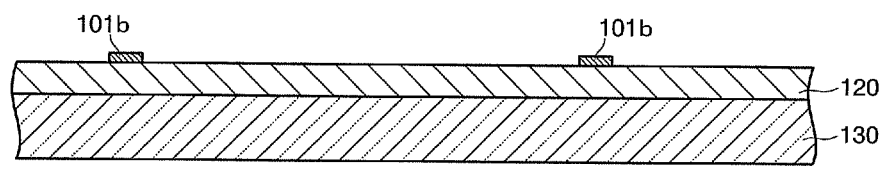
FIG. 24 is a cross sectional view showing the formation of the rewiring terminals 101 according to the modification example 3 in order of processes.

The method of forming the rewiring terminals 101 can be further changeable. Next, a modification example 3 of the formation of the rewiring terminals 101 will be described by using FIG. 22 to FIG. 24. FIG. 22 to FIG. 24 are cross-sectional views showing the formation of the rewiring terminals 101 according to the modification example 3 in order of processes.

In the modification example 3, a sputtering apparatus 300 is used to form the rewiring terminals 101. A material of a target 310 used in the sputtering apparatus 300 is, for example, metal or aluminum.

First, a mask 320 is disposed on the tacky sheet 120. The mask 320 includes opening portions 320a used to form the rewiring terminals 101 at predetermined positions on the tacky sheet 120. The mask 320 is preferably easily peelable from the tacky sheet 120. Therefore, it is desirable that the mask 320 is made of a material easily peelable or is subjected to surface treatment so as to be easily peelable.

Next, the support substrate 130 on which the mask 320 is disposed is placed on a stage electrode 330 of the sputtering apparatus 300.

In the sputtering apparatus 300, ionized filler gas collides with the target 310 in accordance with the application of a high voltage, and as a result, metal particles are sputtered out from the target 310. As a result, as shown in FIG. 23, thin films 101b are formed on the mask 320. Further, by the metal particles passing through the opening portions 320a, the thin films 101b are also formed on the tacky sheet 120.

The thin films 101b formed on the tacky sheet 120 function as the rewiring terminals 101. When the rewiring terminals 101 are made of aluminum, the wires 106 can be bonded to the rewiring terminals 101 if the height-direction thickness of the rewiring terminals 101 is about 200 nm or more. Incidentally, the thickness of the thin films 101b, that is, the thickness of the rewiring terminals 101 can be appropriately adjusted by the operation of the sputtering apparatus 300.

After the thin films 101b are formed, the support substrate 130 is taken out from the sputtering apparatus 300 and the mask 320 is peeled off from the tacky sheet 120. As a result, as shown in FIG. 24, only the thin films 101b functioning as the rewiring terminals 101 are left on the tacky sheet 120.

As described above, according to the modification example 3, it is possible to form the rewiring terminals 101 by using the sputtering apparatus 300.

OTHER MODIFICATION EXAMPLES

In the above-described modification example 3, the mask 320 is used for the formation of the rewiring terminals 101. Alternatively, as a substitute for the mask 320, a release film (not shown) stuck on the tacky sheet 120 may be used. In this case, openings corresponding to the opening portions 320a are provided in advance in the release film. Then, when the tacky sheet 120 is stuck on the support substrate 130, the release film is left as it is as a mask film of the tacky sheet 120. By the film deposition by the sputtering apparatus 300 in this state (sputtering), it is possible to form the rewiring terminals 101 on the tacky sheet 120 as are formed when the mask 320 is used.

By using the protective films as a substitute for the mask 320, it is possible to skip the processes of sticking and peeling the mask 320 to/from the tacky sheet 120, which enables the efficient manufacture of the rewiring terminals 101. The efficient manufacture of the rewiring terminals 101 enables the efficient manufacture of the semiconductor device 1 as a result. Further, using the protective films as a substitute for the mask 320 can reduce cost required for the mask 320.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of methods and devices described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming, on a sheet having tackiness, a terminal member that is to be connected to a first semiconductor element;
    mounting a second semiconductor element on the sheet on which the terminal member is formed;
    mounting the first semiconductor element on the second semiconductor element via an adhesive layer;
    connecting the first semiconductor element directly to the terminal member via a single wire;
    forming, on the sheet, a resin layer sealing the first and second semiconductor elements, the terminal member, and the wire;
    reducing the tackiness of the sheet;
    peeling the resin layer from the sheet having the reduced tackiness to expose a surface of the second semiconductor element and a surface of the terminal member; and
    forming a wiring in a single layer directly connected to the exposed surface of the second semiconductor element and the exposed surface of the terminal member so that the first and second semiconductor elements are electrically connected through the wiring, the wiring being outside the resin layer.

2. The method of manufacturing the semiconductor device according to claim 1, wherein the forming the terminal member comprises:
    forming the terminal member on a tacky film having a weaker tacky strength than the tacky sheet; and
    pressing the terminal member formed on the tacky film against the tacky sheet to transfer the terminal member from the tacky film to the tacky sheet.

3. The method of manufacturing the semiconductor device according to claim 1, wherein the forming the terminal member comprises:
- supplying metal in paste form to a member having a hole portion whose shape corresponds to a shape of the terminal member; and
- printing the supplied metal onto the sheet.

4. The method of manufacturing the semiconductor device according to claim 1, wherein the forming the terminal member comprises:
- putting, on the sheet, a mask member having a hole portion whose shape corresponds to a shape of the terminal member;
- forming a film on the sheet on which the mask member is put; and
- removing the mask member from the sheet.

5. The method of manufacturing the semiconductor device according to claim 1, wherein the forming the terminal member comprises irradiating the sheet with ultraviolet.

6. The method of manufacturing the semiconductor device according to claim 1, further comprising,
- forming a solder bump electrically connected to the wiring.

7. The method of manufacturing the semiconductor device according to claim 1, further comprising,
- mounting a chip component on the sheet, wherein in the forming the resin layer, the resin layer seals the first and second semiconductor elements, the terminal member, the wire, and the chip component.

* * * * *